United States Patent
Enicks et al.

(10) Patent No.: US 7,651,919 B2
(45) Date of Patent: Jan. 26, 2010

(54) BANDGAP AND RECOMBINATION ENGINEERED EMITTER LAYERS FOR SIGE HBT PERFORMANCE OPTIMIZATION

(75) Inventors: Darwin Gene Enicks, Colorado Springs, CO (US); Damian Carver, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 53 days.

(21) Appl. No.: 11/267,553

(22) Filed: Nov. 4, 2005

(65) Prior Publication Data
US 2007/0105330 A1    May 10, 2007

(51) Int. Cl.
*H01L 21/331* (2006.01)
*H01L 21/8222* (2006.01)

(52) U.S. Cl. .............. 438/312; 438/320; 438/350; 257/197; 257/E21.371

(58) Field of Classification Search ............... 257/197, 257/E21.371; 438/312, 320, 350
See application file for complete search history.

(56) References Cited

U.S. PATENT DOCUMENTS

| | | | |
|---|---|---|---|
| 3,888,518 A | | 6/1975 | Delessert |
| 4,352,532 A | | 10/1982 | Hardin |
| 4,383,547 A | | 5/1983 | Lorenz et al. |
| 4,437,479 A | | 3/1984 | Bardina et al. |
| 4,771,326 A | * | 9/1988 | Curran .................. 257/18 |
| 4,852,516 A | | 8/1989 | Rubin et al. |
| 5,001,534 A | | 3/1991 | Lunardi et al. |
| 5,006,912 A | | 4/1991 | Smith et al. |
| 5,137,047 A | | 8/1992 | George |
| 5,247,192 A | | 9/1993 | Nii |
| 5,316,171 A | | 5/1994 | Danner, Jr. et al. |
| 5,316,958 A | * | 5/1994 | Meyerson .............. 117/88 |
| 5,329,145 A | * | 7/1994 | Nakagawa .............. 257/198 |
| 5,331,186 A | | 7/1994 | Morizuka |
| 5,352,912 A | | 10/1994 | Crabbe et al. |

(Continued)

FOREIGN PATENT DOCUMENTS

WO    WO-07055985 A2    5/2007

(Continued)

OTHER PUBLICATIONS

Phil Danielson, "Desorbing Water in Vacuum Systmes: Bakeout or UV?", A Journal of Practical and Useful Vacuum Technology, Jan. 2001, Available at: http://www.vacuumlab.com/Articles/VacLab22%20.pdf (Visited: Jul. 14, 2005).

(Continued)

*Primary Examiner*—Jarrett Stark
(74) *Attorney, Agent, or Firm*—Schwegman, Lundberg & Woessner, P.A.

(57) ABSTRACT

A method for fabricating a heterojunction bipolar transistor (HBT) is provided. The method includes providing a substrate including a collector region; forming a compound base region over the collector region; and forming an emitter region over the compound base region including forming a first emitter layer within the emitter region and doping the first emitter layer with a pre-determined percentage of at least one element associated with the compound base region. In one implementation, an emitter region is formed including multiple emitter layers to enhance a surface recombination surface area within the emitter region.

14 Claims, 5 Drawing Sheets

U.S. PATENT DOCUMENTS

| | | | |
|---|---|---|---|
| 5,412,233 | A | 5/1995 | Dubon-Chevallier et al. |
| 5,426,316 | A | 6/1995 | Mohammad |
| 5,440,152 | A | 8/1995 | Yamazaki |
| 5,449,294 | A | 9/1995 | Rench et al. |
| 5,453,124 | A | 9/1995 | Moslehi et al. |
| 5,494,836 | A | 2/1996 | Imai |
| 5,506,427 | A | 4/1996 | Imai |
| 5,523,243 | A | 6/1996 | Mohammad |
| 5,583,059 | A * | 12/1996 | Burghartz .................. 438/319 |
| 5,656,514 | A | 8/1997 | Ahlgren |
| 5,665,614 | A | 9/1997 | Hafizi et al. |
| 5,668,388 | A | 9/1997 | Delage et al. |
| 5,729,033 | A | 3/1998 | Hafizi |
| 5,757,039 | A | 5/1998 | Delaney et al. |
| 5,798,277 | A | 8/1998 | Ryum et al. |
| 5,821,149 | A * | 10/1998 | Schuppen et al. ........... 438/312 |
| 5,881,476 | A | 3/1999 | Strobush et al. |
| 5,912,481 | A | 6/1999 | El-Sharawy et al. |
| 5,962,880 | A | 10/1999 | Oda et al. |
| 5,972,783 | A * | 10/1999 | Arai et al. .................... 438/513 |
| 5,992,463 | A | 11/1999 | Redemann et al. |
| 6,074,698 | A | 6/2000 | Sakurai et al. |
| 6,099,599 | A | 8/2000 | Wu |
| 6,171,920 | B1 | 1/2001 | El-Sharawy et al. |
| 6,199,255 | B1 | 3/2001 | Wang et al. |
| 6,251,738 | B1 | 6/2001 | Huang |
| 6,325,886 | B1 | 12/2001 | Harris et al. |
| 6,349,744 | B1 | 2/2002 | Grosshart |
| 6,352,591 | B1 | 3/2002 | Yieh et al. |
| 6,410,396 | B1 | 6/2002 | Casady et al. |
| 6,417,059 | B2 | 7/2002 | Huang |
| 6,423,990 | B1 | 7/2002 | El-Sharawy et al. |
| 6,442,867 | B2 | 9/2002 | Pressnall et al. |
| 6,459,104 | B1 | 10/2002 | Schuegraf |
| 6,509,242 | B2 | 1/2003 | Frei et al. |
| 6,531,369 | B1 | 3/2003 | Ozkan et al. |
| 6,541,346 | B2 | 4/2003 | Malik |
| 6,555,852 | B1 * | 4/2003 | Krutsick ..................... 257/197 |
| 6,555,874 | B1 | 4/2003 | Hsu et al. |
| 6,563,145 | B1 | 5/2003 | Chang et al. |
| 6,573,539 | B2 | 6/2003 | Huang |
| 6,598,279 | B1 | 7/2003 | Morgan |
| 6,600,178 | B1 | 7/2003 | Washio et al. |
| 6,607,605 | B2 | 8/2003 | Tan |
| 6,667,489 | B2 | 12/2003 | Suzumura et al. |
| 6,670,654 | B2 | 12/2003 | Lanzerotti et al. |
| 6,696,710 | B2 | 2/2004 | Moll et al. |
| 6,756,615 | B2 | 6/2004 | Yoshioka et al. |
| 6,759,697 | B2 | 7/2004 | Toyoda et al. |
| 6,764,918 | B2 | 7/2004 | Loechelt |
| 6,794,237 | B2 | 9/2004 | Babcock et al. |
| 6,797,578 | B1 * | 9/2004 | U'Ren ........................ 438/309 |
| 6,806,513 | B2 | 10/2004 | Chau et al. |
| 6,861,323 | B2 | 3/2005 | Shideler |
| 6,861,324 | B2 | 3/2005 | Kalnitsky et al. |
| 6,870,204 | B2 | 3/2005 | Torvik et al. |
| 7,183,576 | B2 | 2/2007 | Chu et al. |
| 7,300,849 | B2 | 11/2007 | Enicks et al. |
| 7,439,558 | B2 | 10/2008 | Enicks |
| 2002/0117657 | A1 | 8/2002 | Moll et al. |
| 2002/0135761 | A1 | 9/2002 | Powell et al. |
| 2002/0149033 | A1 | 10/2002 | Wojtowicz |
| 2002/0155670 | A1 | 10/2002 | Malik |
| 2003/0012925 | A1 | 1/2003 | Gorrell |
| 2003/0022528 | A1 | 1/2003 | Todd |
| 2003/0098465 | A1 * | 5/2003 | Suzumura et al. ........... 257/197 |
| 2003/0122154 | A1 | 7/2003 | Babcock et al. |
| 2003/0162370 | A1 * | 8/2003 | Sukegawa et al. ........... 438/478 |
| 2003/0201461 | A1 | 10/2003 | Sato et al. |
| 2003/0203583 | A1 | 10/2003 | Malik |
| 2003/0213977 | A1 | 11/2003 | Toyoda et al. |
| 2004/0123882 | A1 | 7/2004 | Olmer et al. |
| 2004/0188802 | A1 | 9/2004 | Babcock et al. |
| 2004/0256635 | A1 | 12/2004 | Saitoh et al. |
| 2005/0099839 | A1 | 5/2005 | Bhattacharyya |
| 2007/0102729 | A1 | 5/2007 | Enicks et al. |

FOREIGN PATENT DOCUMENTS

| | | |
|---|---|---|
| WO | WO-07056017 A2 | 5/2007 |
| WO | WO-07056030 A2 | 5/2007 |

OTHER PUBLICATIONS

Phil Danielson, "Sources of Water Vapor in Vacuum Systems", A Journal of Practical and Useful Vacuum Technology, Sep. 2000, Available at: http://www.vacuumlab.com/Articles/Sources%20of%20Water%20Vapor.pdf (Visited: Jul. 14, 2005).

Sherman Rutherford, "The Benefits of Viton Outgassing", Duniway Stickroom Corp., Feb. 1997, Available at: http://www.duniway.com/images/pdf/pg/viton-out-gaseed-orings.pdf (Visited: Jul. 21, 2005).

Viton Gaskets Brochure, Duniway Stockroom Corp. Available at: http://www.duniway.com/images/pdf/pg/p-sp05b-viton-gaskets.pdf (Visited: Jul. 21, 2005).

"Outgassing and Weight Loss of Elastomers", Problems Solving Products, Inc., 1997-2005, Available at: http://www.pspglobal.com/outgassing-elastomer..html (Visited: Jul. 14, 2005).

"O-Ring Performance", Kurt J. Lesker Comp., 1996-2004, Available at: http://www.lesker.com/newweb/Vacuum_Components/O_Ring_Seal/O-ring_performance.cfm?CFID=266017&CFTOKEN=49827656 (Visited: Jul. 14, 2005).

Phil Danielson, "The Effects of Humidity on Vacuum Systems", A Journal of Practical and Useful Vacuum Technology, Jun. 2001, Available at: http://www.vacuumlab.com/Articles/VacLab27.pdf (Visited: Jul. 14, 2005).

Robert Lowry, "Sources and Control of Volatile Gases Hazardous to Hermetic Electronic Enclosures", 1999, International Symposium on Advanced Packaging Materials, pp. 94-99.

Darwin Enicks, "A Study of Process-Induced Oxygen Updiffusion in Pseudomorphic Boron-Doped Sub-50 nm SiGeC Layers Grown by LPCVD", Electrochemical and Solid-State Letters, 2005, G286-G289.

Phil Danielson, "Understanding Water Vapor in Vacuum Systems", Microelectronic Manufacturing and Testing, Jul. 1990, 2 pages.

Phil Danielson, "Gas Loads and O-Rings", A Journal of Practical and Useful Vacuum Technology, Aug. 2000, Available at: http://www.vacuumlab.com/Articles/Gas%20Loads%20and%20O-Rings.pdf (Visited: Jul. 14, 2005), 4 pages.

T. Ghani et al., "Effects of Oxygen on Minority-Carrier Lifetime and Recombination Currents in Si(1-x)Ge(x) Heterostructure Devices", Appl. Phys. Lett., vol. 58, Mar. 12, 1991, pp. 1317-1319.

Kunz et al., "Polycrystalline Silicon-Germanium Emitters for Gain Control, With Application to SiGe HGTs", IEEE Transactions on Electron Devices, vol. 50, No. 6, Jun. 2003.

"U.S. Appl. No. 11/267,473 Notice of Allowance mailed Jun. 13, 2008", 6 pgs.

"U.S. Appl. No. 11/267,473 Response filed May 6, 2008 to Non-Final Office Action mailed Feb. 6, 2008", 14 pages.

"U.S. Appl. No. 11/267,473, Non-Final Office Action mailed Feb. 06, 2008", 18 Pgs.

"U.S. Appl. No. 11/267,474 Non-Final Office Action mailed Apr. 02, 2008.", 18 pgs.

"U.S. Appl. No. 11/267,474 Response filed Jun. 30, 2008 to Non-Final Office Action mailed Apr. 2, 2008", 12 pgs.

"Outgassing and Weight Loss of Elastomers", *Problem Solving Products, Inc. 1997-2005*, Available at http://www.pspglobal.com/outgassing-elastomers.html (Visited: Jul. 14, 2005).

"Viton Gaskets Brochure", *Duniway Stockroom Corp.*, Available at http://www.duniway.com/images/pdf/pg/p-sp05b-viton-gaskets.pdf (visited Jul. 21, 2005).

Danielson, Phil, "Desorbing Water in Vacuum Systems: Bakeout or UV?", *A Journal of Practical and Useful Vacuum Technology*, Available at: http://www.vacuumlab.com/Articles/VacLab22%20.pdf (visited Jul. 14, 2005), (Jan. 2001), 5 Pgs.

Danielson, Phil, "Gas Loads and O-Rings", *A Journal of Practical and Useful Vacuum Technology*, Available at: http://www.vacuumlab.com/Articles/Gas%20Loads°/20and%20O-Rings.pdf (Visited: Jul. 14, 2005), (Aug. 2000), 4 pgs.

Danielson, Phil, "Sources of Water Vapor in Vacuum Systems", *A Journal of Practical And Useful Vacuum Technology*, Available at: http://www.vacuumlab.com/Articles/Sources%20of%20Water%20Vapor.pdf (visited Jul. 14, 2005), (Sep. 2000).

Danielson, Phil, "The Effects of Humidity on Vacuum Systems", *A Journal of Practical And Useful Vacuum Technology*, Available at: http://www.vacuumlab.com/Articles/VacLab27.pdf (Visited: Jul. 14, 2005), (Jun. 2001).

Enicks, D., "A Study of Process-Induced Oxygen Updiffusion in Pseudomorphic Boron-Doped Sub-50 nm SiGeC Layers Grown by LPCVD", *Electrochemical and Solid-State Letters*, 8(10), (2005), G286-G289.

Ghani, T., et al., "Effect of Oxygen on Minority-Carrier Lifetime and Recombination Currents in $Si(1-x)Ge(x)$ Heterostructure Devices", *Appl. Phys. Lett.*, vol. 58, 12, (Mar 1991), 1317-1319.

Kunz, et al., "Polycrystalline Silicon-Germanium Emitters for Gain Control, With Application to SiGe HBTs", *IEEE Transactions on Electron Devices*, vol. 50, No. 6 (Jun. 2003).

Lowry, Robert, "Sources and Control of Volatile Gases Hazardous to Hermetic Electronic Enclosures", *International Symposium on Advanced Packaging Materials*, (1999), 94-99

Rutherford, Sherman, "The Benefits of Viton Outgassing", *Duniway Stockroom Corp.*, Available at http://www.duniway.com/images/pdf/pg/viton-out-gassed-orings.pdf. (visited: Jul. 21, 2005), (Feb. 1997).

"O-Ring Performance", *Kurt J. Lesker Comp.*, 1996-2004, Available at: http://www.lesker.com/newweb/Vacuum_Components/O_Ring_Seals/O-ring_performance.cfm?CFID266017&CFTOKEN=49827656 (Visited: Jul. 14, 2005).

Danielson, Phil, "Understanding Water Vapor in Vacuum Systems", *Microelectronic Manufacturing and Testing*, 13(8), (Jul. 1990), 2 pgs.

* cited by examiner

BANDGAP AND RECOMBINATION ENGINEERED EMITTER LAYERS FOR SIGE HBT PERFORMANCE OPTIMIZATION

CROSS-REFERENCE TO RELATED APPLICATIONS

The present application is related to co-pending U.S. patent application Ser. No. 11/267,473 entitled Method and System for Controlled Oxygen Incorporation in Compound Semiconductor Films for Device Performance Enhancement (3506P) filed on even date herewith and assigned to the assignee of the present application, and U.S. patent application Ser. No. 11/267,474 entitled Method and System for Providing a Heterojunction Bipolar Transistor having SiGe Extensions (3507P) filed on even date herewith and assigned to the assignee of the present application, and U.S. patent application Ser. No. 11/266,797 entitled Bandgap Engineered Mono-Crystalline Silicon Cap Layers for SiGe HBT Performance Enhancement (3508P) filed on even date herewith and assigned to the assignee of the present application.

FIELD OF THE INVENTION

The present invention relates generally to heterojunction bipolar transistors (HBTs), and methods for fabricating HBTs.

BACKGROUND OF THE INVENTION

Bipolar transistors are important components in, for example, logic circuits, communication systems, and microwave devices. One type of bipolar transistor is a silicon germanium (SiGe) heterojunction bipolar transistor (HBT). An SiGe HBT can typically handle signals of very high frequencies, e.g., up to several hundred GHz.

Strained SiGe is typically the film of choice for application in NPN HBTs. The SiGe is pseudomorphically grown to match the silicon lattice beneath the SiGe and is, therefore, in a compressively strained state. Subsequent to the pseudomorphic growth process (and in the same reactor) a silicon cap layer can be grown. The silicon cap layer is conventionally doped n-type during the same process using either arsenic (As) or phosphorus (P)—e.g., arsine (AsH3) and phosphine (PH3) are typical dopant gases. The silicon cap layer maintains the SiGe in a strained condition during thermal anneal processes.

After formation of the silicon cap layer, an emitter region is typically formed within an SiGe HBT. The emitter region typically comprises an amorphous, poly-crystalline or mono-crystalline film type. The emitter region is conventionally doped with arsenic (As), phosphorus (P), or another group V element. The emitter region can further include germanium (Ge) to form a polySiGe emitter layer. Conventional SiGe HBTs with a polySiGe emitter layer, however, typically include an oxide interface (or oxide layer) that is formed between the silicon cap layer and the polySiGe emitter layer.

Common device performance metrics of an SiGe HBT include a measurement of a current gain and a breakdown voltage (e.g., the collector-to-emitter breakdown (BVCE0)) associated with the SiGe HBT. Various device parameters that can affect the current gain and/or the breakdown voltage include, for example, a collector current, a base current, emitter resistance, and the like. A common goal of designers is to seek new ways to add device-tuning capability to conventional SiGe HBTs that can affect one or more of these device parameters to reduce current gains and increase breakdown voltages of an SiGe HBT.

Accordingly, what is needed are methods of material engineering that will reduce current gains and increase the breakdown voltages, e.g., the BVCE0, of an SiGe HBT without adverse affect to device speed and power requirements. The present invention addresses such a need.

BRIEF SUMMARY OF THE INVENTION

In general, in one aspect, this specification describes a method for fabricating a heterojunction bipolar transistor (HBT). The method includes providing a substrate including a collector region; forming a compound base region over the collector region; and forming an emitter region over the compound base region including forming a first emitter layer within the emitter region and doping the first emitter layer with a pre-determined percentage of at least one element associated with the compound base region.

Particular implementations can include one or more of the following features. Forming a first emitter layer can further include doping the first emitter layer with a diffusion modulating impurity. Doping the first emitter layer with a diffusion modulating impurity can include doping the first emitter layer with carbon (C), nitrogen (N), fluorine (F), or oxygen (O). Doping the first emitter layer with carbon (C), nitrogen, fluorine (F), or oxygen (O) includes doping the first emitter layer such that carbon (C), nitrogen (N), fluorine (F), or oxygen (O) levels are substantially in the range of 5E17 atoms/cc to 5E21 atoms/cc. Forming an emitter region can further include forming one or more second emitter layers within the emitter region. Each of the first emitter layer and the one or more second emitter layers can be each doped with a different percentage of at least one element within the compound base region relative to one another. At least one of the first emitter layer and the one or more second emitter layers can include 0% of the at least one element to enhance a surface recombination surface area within the emitter region. Forming a first emitter layer can further include performing an HF last clean and a hydrogen pre-bake prior to forming the first emitter layer to create an oxide free interface between the first emitter layer and an adjacent layer. Forming a first emitter layer can include forming the first emitter layer at a temperature substantially ranging from 550° C. to 850° C.

In general, in another aspect, this specification describes a method for fabricating a heterojunction bipolar transistor (HBT) including providing a substrate including a collector region; depositing silicon germanium (SiGe) to form a base region over the collector region; and forming an emitter region over the base region including forming a first emitter layer within the emitter region and doping the first emitter layer with a pre-determined percentage of germanium (Ge).

Particular implementations can include one or more of the following features. The method can further include forming a base/collector spacer between the base region and the collector region, and forming a base/emitter spacer between the base region and the emitter region. Forming a first emitter layer can further include doping the first emitter layer with a diffusion modulating impurity. Doping the first emitter layer with a diffusion modulating impurity can include doping the first emitter layer with carbon (C), nitrogen (N), fluorine (F), or oxygen (O). Doping the first emitter layer with carbon (C), nitrogen (N), fluorine (F), or oxygen (O) can include doping the first emitter layer such that carbon (C), nitrogen (N), fluorine (F), or oxygen (O) levels are substantially in the range of 5E17 atoms/cc to 5E21 atoms/cc. Doping the first emitter layer with a pre-determined percentage of germanium (Ge) can include doping the first emitter layer such that a percentage of germanium (Ge) within the first emitter layer is substantially in the range of 0% to 65%. Forming an emitter region can further include forming one or more second emitter layers within the emitter region. Each of the first emitter layer and the one or more second emitter layers can be each doped with a different percentage of germanium (Ge) relative to one another. At least one of the first emitter layer and the one or more second emitter layers can include 0% of germanium (Ge) to enhance a surface recombination surface area within the emitter region.

In general, in another aspect, this specification describes a heterojunction bipolar transistor (HBT) including a substrate including a collector region, and a base region formed over the collector region. The base region includes silicon germanium (SiGe). The heterojunction bipolar transistor (HBT) further includes an emitter region formed over the silicon cap layer, in which the emitter region includes a first emitter layer being doped with a pre-determined percentage of germanium (Ge).

Implementations may provide one or more of the following advantages. The addition of germanium (Ge) and/or diffusion limiting impurities—e.g., carbon (C), nitrogen (N), fluorine (F) and/or oxygen (O)—to one or more emitter layers within an emitter region of an SiGe HBT will add additional device-tuning capability to the SiGe HBT, while maintaining the benefits of conventional SiGe HBTs. The addition of germanium (Ge) to an emitter layer can reduce the rate of dopant diffusion for phosphorus (P) and increase the rate of dopant diffusion for arsenic (As). The emitter layer (including germanium (Ge)) is also formed without an oxide interface between the emitter layer and a silicon cap layer—i.e., an SiGe HBT is provided that includes an oxide-free growth interface for polySiGe emitter nucleation and growth. In addition, an SiGe HBT is provided that includes an emitter having multiple polySiGe/polySi surface recombination interfaces. The multiple polySiGe/polySi interfaces enhance a surface recombination current of the SiGe HBT due to increased surface area for recombination provided by the multiple polySiGe/polySi interfaces. Additionally, diffusion modulating impurities can be added to the emitter layer to allow engineering and control of the formation of the base-emitter metallurgical junction within an SiGe HBT.

Additionally, poly-SiGe possesses enhanced hole mobilities and activation as compared to poly-silicon, and similar electron activation and mobility for germanium (Ge) fractions up to approximately 40%. Additionally, a bandgap associated with an SiGe HBT can be tailored through control of the amount of germanium (Ge) incorporated (or doped) into the emitter region. The addition of germanium (Ge) into the emitter region further adds additional device parameter tuning to affect the collector current and base current, which also affects current gains and breakdown voltages associated with an SiGe HBT. This additional tuning capability occurs because of increased surface recombination velocity at the polySiGe/mono-silicon interface (i.e., the polySiGe/silicon cap interface).

The details of one or more implementations are set forth in the accompanying drawings and the description below. Other features and advantages will be apparent from the description and drawings, and from the claims.

BRIEF DESCRIPTION OF SEVERAL VIEWS OF THE DRAWINGS

Like reference symbols in the various drawings indicate like elements.

DETAILED DESCRIPTION OF THE INVENTION

The present invention relates generally to heterojunction bipolar transistors (HBTs), and methods for fabricating HBTs. The following description is presented to enable one of ordinary skill in the art to make and use the invention and is provided in the context of a patent application and its requirements. Various modifications to the preferred implementations and the generic principles and feature described herein will be readily apparent to those skilled in the art. Thus, the present invention is not intended to be limited to the implementations shown but is to be accorded the widest scope consistent with the principles and features described herein.

In addition, manufacturing steps are described below with enough detail to show relationships between elements of the completed device. Many fabrication details are omitted from this description, with the understanding that those skilled in the art may employ as many of those details as are a called for in any particular design. Moreover, when description is given in this application of fabrication steps, those skilled in the art will realize that each such step may actually comprise one or more discrete steps and that other steps, not described herein, may be necessary to achieve specific applications of the invention.

Figure 1:
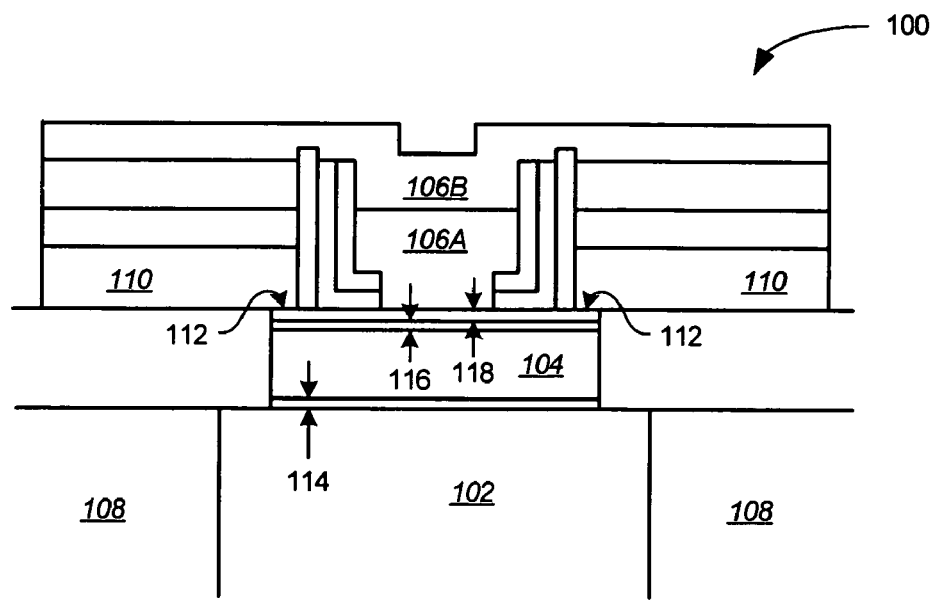
FIG. 1 is a schematic cross-sectional view of an SiGe HBT.

FIG. 1 illustrates a cross-sectional view of an SiGe HBT 100. SiGe HBT 100 includes a collector region 102, a base region 104, and an emitter region composed of a plurality of emitter layers 106A-106B. Though two emitter layers are illustrated in FIG. 1, the emitter region of SiGe HBT 100 can include any number of emitter layers.

Collector region 102 is formed within a substrate 108. In one implementation, collector region 102 is n-type. Base region 104 is a compound layer that can include, e.g., p-type SiGe or SiGeC. Base region 104 can be formed as described in contemporaneously filed U.S. patent application—"Method and System For Providing a Heterojunction Bipolar Transistor Having Controlled Oxygen Incorporation" by Darwin Enicks and John Chaffee, U.S. Ser. No. 11/267,473, which is incorporated by reference in its entirety.

A silicon base electrode 110 at least partially overlies base region 104, and a contact 112 connects base region 104 to silicon base electrode 110. In one implementation, base region 104 includes a base/collector spacer 114 and a base/emitter spacer 116. Base/collector spacer 114 separates base region 104 from collector region 102. Base/emitter spacer 116 separates base region 104 from the emitter region 106.

Base region 104 further includes a mono-crystalline silicon cap layer 118. Though a single silicon cap layer 118 is shown, more than one silicon cap layer can be implemented within SiGe HBT 100. In one implementation, silicon cap layer 118 is doped n-type using either arsenic (As) or phosphorus (P). Silicon cap layer 118 (and any other silicon cap layers (not shown)) can also be formed as described in contemporaneously filed U.S. patent application—"Bandgap Engineered Mono-Crystalline Silicon Cap Layers for SiGe HBT Performance Enhancement" by Darwin Enicks and Damian Carver, U.S. Ser. No. 11/266,797, which is incorporated by reference in its entirety.

In one implementation, emitter layers 106A-106B of the emitter region are doped n-type. Emitter layers 106A-106B can be doped with arsenic (As), phosphorous (P), or any other group V element. Emitter layers 106A-106B are further doped to include a pre-determined amount (or percentage) of germanium (Ge). In one implementation, each emitter layer 106A-106B contains a different percentage of germanium (Ge) relative to one another (as described in greater detail below). The addition of germanium (Ge) to an emitter layer (e.g., emitter layers 106A-106B) enhances the surface recombination velocity of holes at the polySiGe/silicon cap layer interface.

Additionally, emitter layers 106A-106B can be doped with carbon (C) or oxygen (O) (or other diffusion modulating impurities such as nitrogen (N) and fluorine (F)) to tailor the base-emitter metallurgical junction profile, carrier recombination rates, surface recombination velocities at contact 112 and the emitter/silicon cap layer interface, dopant diffusion rates (through the emitter region), and dopant profiles within the emitter region.

Figure 2:
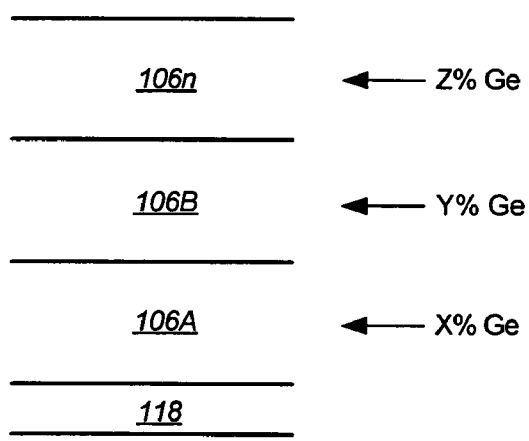
FIG. 2 is a schematic cross-sectional view of the emitter region of the SiGe HBT of FIG. 1.

FIG. 2 illustrates a schematic cross-sectional view of the emitter region of SiGe HBT 100 of FIG. 1, including emitter layers 106A-106n, where "n" represents an integer number. Though multiple emitter layers are shown in FIG. 2, the emitter region can include only a single emitter layer. Emitter layer 106A is formed over silicon cap layer 118. In one implementation, each emitter layer 106A-106n contains a different percentage of germanium (Ge) relative to one another. For example, as shown in FIG. 2, emitter layer 106A is doped to contain X % of germanium (Ge), emitter layer 106B is doped to contain Y % of germanium (Ge), and emitter layer 106n is doped to contain Z % of germanium (Ge). In one implementation, the percentage of germanium (Ge) within an emitter layer 106A-106n is substantially in the range of 0% to 65%. It should be noted that by alternating emitter layers (including some percentage of germanium (Ge)) with adjacent layers of poly-Si (having 0% germanium (Ge)), the emitter resistance and recombination current due to hole recombination can be tailored. The recombination tailoring is accomplished by the addition of multiple polySiGe/poly-Si interfaces, where the surface recombination velocity is enhanced. In one implementation, the growth of the polySiGe and/or poly-Si emitter layers occurs at temperatures substantially in the range of 550° C. to 700° C., with gases of SiH4, GeH4, and an H2 ambient.

The polySiGe/silicon cap layer interface is an oxide free interface, unlike in conventional SiGe HBTs. In one implementation, the oxide free interface between the polySiGe emitter layer and the silicon cap layer is accomplished by performing an HF last clean prior to growth of the polySiGe layer, and then (within the same process) performing a hydrogen (H2) pre-bake at temperatures substantially at or above 600° C. just before growth of the polySiGe layer. In conventional processes, temperatures greater than 900° C. are typically utilized for oxide removal, however, implementing the low oxygen fabrication methods discussed below, temperatures below 900° C. are effective for fabricating an SiGe HBT in accordance with the invention.

The oxide free interface avoids hot electron injection effects, which inhibits surface recombination. Hot electron injection is a tunneling phenomenon that typically occurs during tunneling of carriers through an oxide layer. In one implementation, in addition to performing an HF last clean followed by a subsequent hydrogen (H2) pre-bake, the oxide free interface is formed through oxygen reduction methods as described in U.S. patent application—"System, Apparatus and Method for Contamination Reduction in Semiconductor Device Fabrication Equipment Components", application Ser. No. 10/801,435, and in U.S. patent application—"Very Low Moisture O-Ring and Method For Preparing The Same", U.S. application publication number 20040117968, both of which are incorporated by reference herein.

Figure 3:
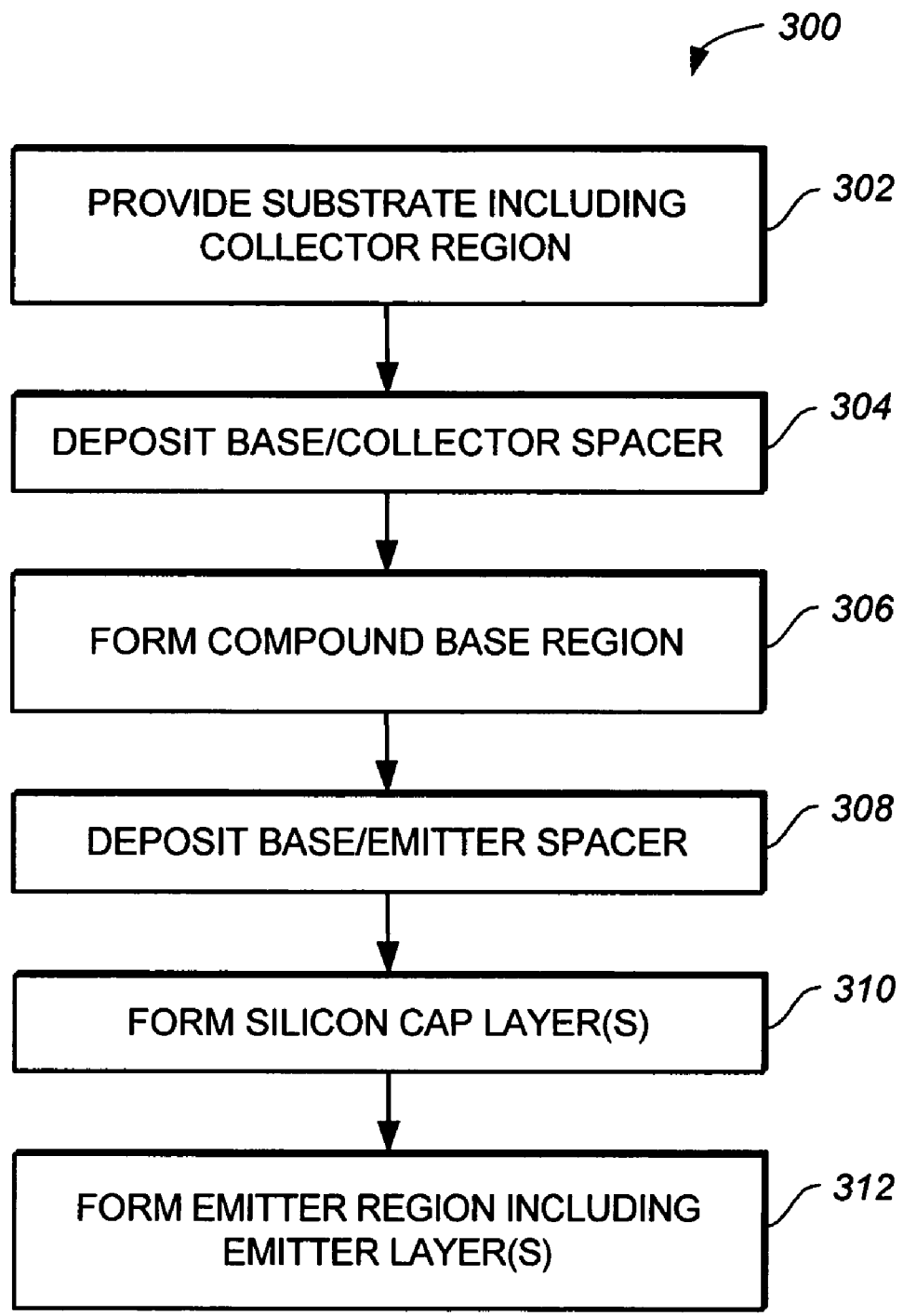
FIG. 3 is a flow diagram illustrating a process for fabricating an SiGe HBT.

FIG. 3 illustrates a process 300 of fabricating an SiGe HBT (e.g., SiGe HBT 100). Although process 300 is presented as a series of numbered steps for the purposes of clarity, no order should be inferred from the numbering.

Figure 4A:
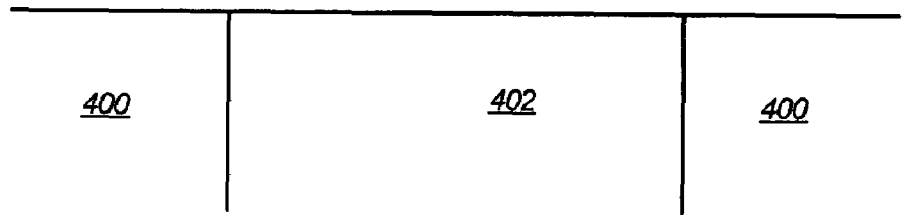
FIGS. 4A-4F illustrate the process of fabricating an SiGe HBT according to the process of FIG. 3.
Figure 4B:
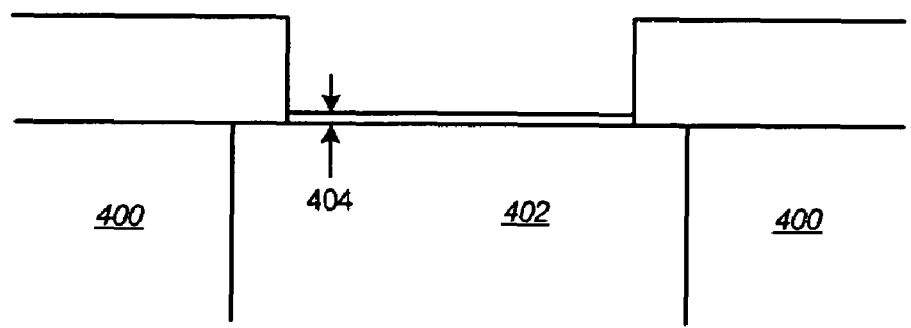
Figure 4C:
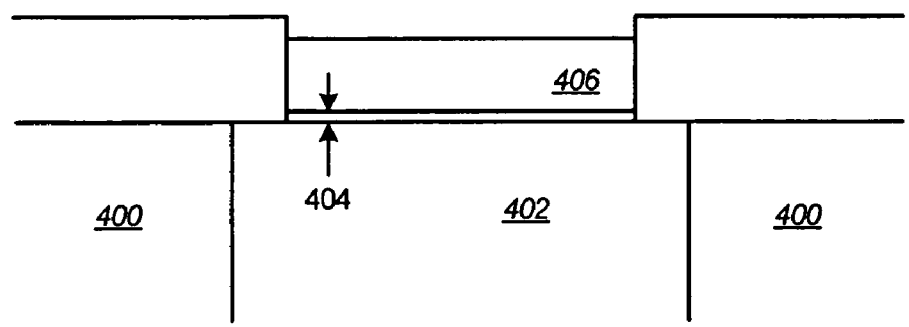
Figure 4D:
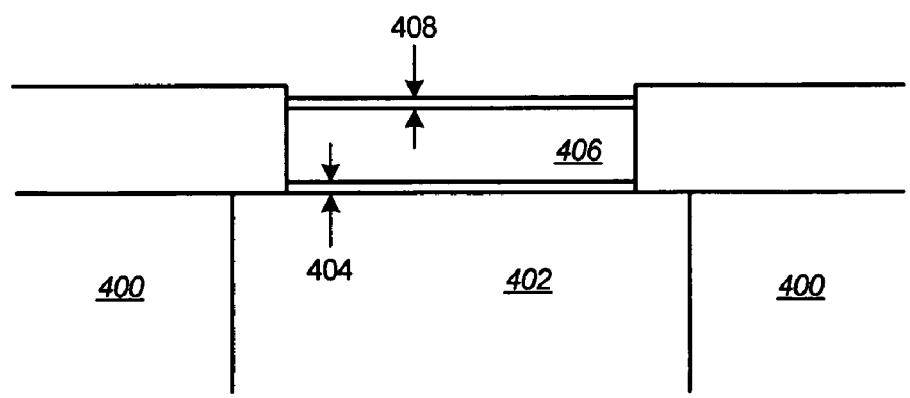

Process 300 begins with providing a substrate including a collector region (step 302). The substrate can be a p-type substrate or an n-type substrate. In one implementation, the collector region is doped n-type. Referring to the example of FIG. 4A, an n-type substrate 400 is provided including an n-type collector region 402. An n-type silicon and/or SiGe seed layer can further be formed over collector region 402 (not shown). A base/collector spacer is deposited over the collector region (step 304). The base/collector spacer can be n-type and/or undoped SiGe. As shown in FIG. 4B, a base/collector spacer 404 is deposited over collector region 402. A compound base region is formed over the base/collector spacer (step 306). In one implementation, a p-type silicon germanium (SiGe) base region is formed. Referring to FIG. 4C, a p-type SiGe base region 406 is deposited over base/collector spacer 404. A base/emitter spacer is deposited over the SiGe base region (step 308). As with the base/collector spacer, the base/emitter spacer can be n-type and/or undoped SiGe. A base/emitter spacer 408 is deposited over SiGe base region 406 (FIG. 4D).

Figure 4E:
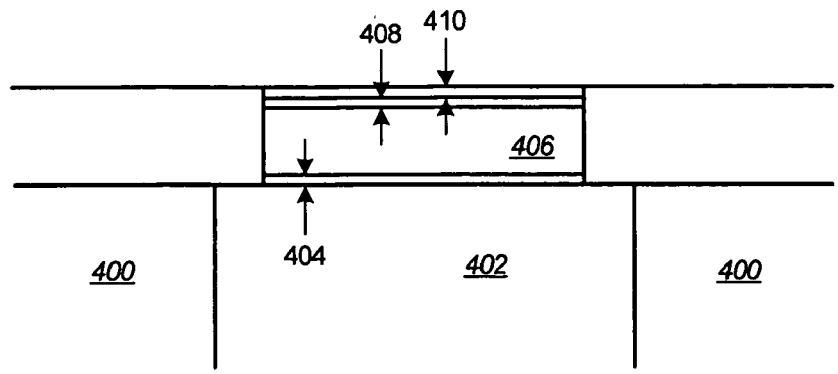

A mono-crystalline silicon cap layer is formed over the base/emitter spacer (step 310). In one implementation, an n-type region of the silicon cap layer is doped (in-situ) with phosphorus (P) or Arsenic (As). Accordingly, as shown in FIG. 4E, a silicon cap layer 410 is formed over base/emitter spacer 408.

An emitter region is formed, including one or more emitter layers, over the silicon cap layer (step 312). In one implementation, each emitter layer is formed with process temperatures substantially ranging from 550° C. to 850° C. Each emitter layer can be doped (in-situ) with phosphorus (P) or arsenic (As), during chemical vapor deposition (CVD) or through ion implantation. In one implementation, arsenic (As) and/or phosphorus (P) doping levels are substantially in the range of 5E17 atoms/cc to 5E21 atoms/cc. Each emitter layer can also be doped (in-situ) during chemical vapor deposition (CVD) or through ion implantation with diffusion modulating impurities, e.g., carbon (C) or oxygen (O). In one implementation, carbon and/or oxygen levels are substantially in the range of 5E17 atoms/cc to 5E21 atoms/cc. As discussed above, the percentage of germanium (Ge) within an emitter layer is substantially in the range of 0% to 65%. In one implementation, 0% germanium is used within an emitter layer where a poly-Si (emitter) layers are desired in order to create multiple "surface recombination layers" (as discussed above) to enhance hole current. Further, doping profiles within each emitter layer can be graded for optimum device parameter control.

Figure 4F:
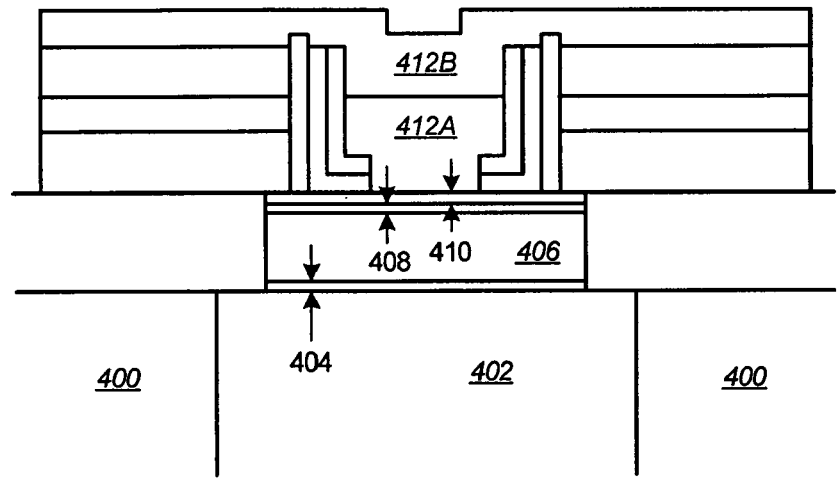

Gas sources that can be used during the growth process of an emitter layer include: SiH4—silicon source, GeH4—germanium source, CH3SIH3—carbon source, AsH3—arsenic source, PH3—phosphorus source, and hydrogen or helium can be used as the carrier gas. Accordingly, as shown in FIG. 4F, an emitter region is formed including emitter layers 412A-412B over silicon cap layer 410.

Figure 5:
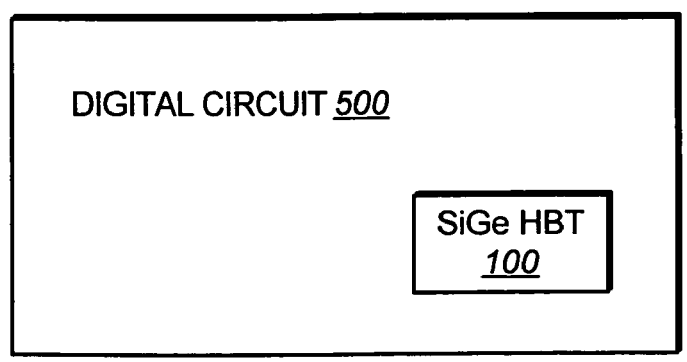
FIG. 5 illustrates a digital circuit including the SiGe HBT of FIG. 1.

An SiGe HBT according to the present invention (e.g., SiGe HBT 100) can be implemented within any type of digital circuit—e.g., digital circuit 500 as shown in FIG. 5. Digital circuit 500 can be associated with one or more of microcontrollers, memories, logic circuits, radio frequency (RF) components, sensors, communication systems, microwave devices, and the like.

Various implementations for fabricating an SiGe HBT have been described. Nevertheless, one or ordinary skill in the art will readily recognize that there that various modifications may be made to the implementations, and any variation would be within the spirit and scope of the present invention. For example, as discussed above, poly-Si emitter layers (having 0% germanium (Ge)) can be sandwiched between polySiGe emitter layers to further enhance surface recombination. Additionally, emitter layers in accordance with the invention can be formed according to methods disclosed in contemporaneously filed U.S. patent application—"A Semiconductive Film With Dopant Diffusion Barrier and Tunable Work Function" by Darwin Enicks, which is incorporated by reference herein. Accordingly, many modifications may be made by one of ordinary skill in the art without departing from the spirit and scope of the following claims.

We claim:

1. A method for fabricating a heterojunction bipolar transistor (HBT), the method comprising:
   providing a substrate including a collector region;
   forming a compound base region over the collector region; and
   forming a single crystal silicon cap region over the compound base region having an n-type doping level;
   forming a base electrode above the base region and contacting a peripheral portion of at least one of the compound base region and the single crystal cap region; and
   forming a compound emitter region over the single crystal silicon cap region and the compound base region including forming a first emitter layer within the emitter region and doping the first emitter layer with a pre-determined percentage of germanium wherein forming an emitter region further includes forming a plurality of separately formed second emitter layers within the emitter region, each having a selected percentage of germanium,
   wherein each of the first emitter layer and the one or more second emitter layers are each doped with a different percentage of germanium relative to one another.

2. The method of claim 1, wherein forming a first emitter layer further includes doping the first emitter layer with a diffusion modulating impurity.

3. The method of claim 2, wherein doping the first emitter layer with a diffusion modulating impurity includes doping the first emitter layer with carbon (C), nitrogen (N), fluorine (F), or oxygen (O).

4. The method of claim 3, wherein doping the first emitter layer with carbon (C), nitrogen (N), fluorine (F), or oxygen (O) includes doping the first emitter layer such that carbon (C), nitrogen (N), fluorine (F), or oxygen (O) levels are substantially in the range of 5E17 atoms/cc to 5E21 atoms/cc.

5. The method of claim 1, wherein at least one of the first emitter layer and the one or more second emitter layers includes 0% of germanium to enhance a surface recombination surface area within the emitter region.

6. The method of claim 1, wherein forming a first emitter layer further includes performing an HF last clean and a hydrogen pre-bake prior to forming the first emitter layer to create an oxide free interface between the first emitter layer and an adjacent layer.

7. The method of claim 1, wherein forming a first emitter layer includes forming the first emitter layer at a temperature substantially ranging from 550° C. to 850° C.

8. A method for fabricating a heterojunction bipolar transistor (HBT), the method comprising:
   providing a substrate including a collector region;
   depositing silicon germanium (SiGe) to form a base region over the collector region; and
   forming a single crystal silicon cap region over the compound base region having an n-type doping level;
   forming a base electrode above the base region and contacting a peripheral portion of at least one of the compound base region and the single crystal cap region; and
   forming an emitter region over the single crystal silicon cap region over the compound base region including forming a first emitter layer within the emitter region and doping the first emitter layer with a pre-determined percentage of germanium (Ge), wherein forming an emitter region further includes forming one or more second emitter layers within the emitter region, wherein each of the first emitter layer and the one or more second emitter layers are each doped with a different percentage of germanium (Ge) relative to one another.

9. The method of claim 8, further comprising:
   forming a base/collector spacer between the base region and the collector region; and
   forming a base/emitter spacer between the base region and the emitter region.

10. The method of claim 8, wherein forming a first emitter layer further includes doping the first emitter layer with a diffusion modulating impurity.

11. The method of claim 10, wherein doping the first emitter layer with a diffusion modulating impurity includes doping the first emitter layer with carbon (C), nitrogen (N), fluorine (F), or oxygen (O).

12. The method of claim 11, wherein doping the first emitter layer with carbon (C), nitrogen (N), fluorine (F), or oxygen (O) includes doping the first emitter layer such that carbon (C), nitrogen (N), fluorine (F), or oxygen (O) levels are substantially in the range of 5E17 atoms/cc to 5E21 atoms/cc.

13. The method of claim 8, wherein doping the first emitter layer with a pre-determined percentage of germanium (Ge) includes doping the first emitter layer such that a percentage of germanium (Ge) within the first emitter layer is substantially in the range of 0% to 65%.

14. The method of claim 8, wherein at least one of the first emitter layer and the one or more second emitter layers includes 0% of germanium (Ge) to enhance a surface recombination surface area within the emitter region.

* * * * *

UNITED STATES PATENT AND TRADEMARK OFFICE
CERTIFICATE OF CORRECTION

PATENT NO. : 7,651,919 B2 Page 1 of 1
APPLICATION NO. : 11/267553
DATED : January 26, 2010
INVENTOR(S) : Enicks et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 152 days.

Signed and Sealed this

Twenty-eighth Day of December, 2010

David J. Kappos
*Director of the United States Patent and Trademark Office*